(12) United States Patent
Cooney, III et al.

(10) Patent No.: US 7,972,965 B2
(45) Date of Patent: *Jul. 5, 2011

(54) PROCESS FOR INTERFACIAL ADHESION IN LAMINATE STRUCTURES THROUGH PATTERNED ROUGHING OF A SURFACE

(75) Inventors: Edward C. Cooney, III, Jericho, VT (US); Vincent McGahay, Poughkeepsie, NY (US); Thomas M. Shaw, Peekskill, NY (US); Anthony K. Stamper, Williston, VT (US); Matthew E. Colburn, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

This patent is subject to a terminal disclaimer.

(21) Appl. No.: 11/862,706

(22) Filed: Sep. 27, 2007

(65) Prior Publication Data

US 2008/0020546 A1 Jan. 24, 2008

Related U.S. Application Data

(63) Continuation of application No. 10/710,034, filed on Jun. 14, 2004, now Pat. No. 7,303,994.

(51) Int. Cl.
*H01L 21/311* (2006.01)
(52) U.S. Cl. ............... 438/700; 438/694; 257/E21.257; 257/E21.576
(58) Field of Classification Search .............. 438/700, 438/694, 745; 257/E21.257, E21.576
See application file for complete search history.

(56) References Cited

U.S. PATENT DOCUMENTS

| 3,775,120 | A | * | 11/1973 | Black et al. | 430/317 |
| 4,652,467 | A | | 3/1987 | Brinker et al. | |
| 5,224,090 | A | * | 6/1993 | Umeda et al. | 369/284 |
| 5,254,503 | A | | 10/1993 | Kenney | |
| 5,382,315 | A | * | 1/1995 | Kumar | 216/39 |

(Continued)

FOREIGN PATENT DOCUMENTS

JP 08242059 A 9/1996

OTHER PUBLICATIONS

Applied Physics Letters, vol. 79, No. 3, (Jul. 16, 2001).*

*Primary Examiner* — Jarrett J Stark
(74) *Attorney, Agent, or Firm* — Katherine S. Brown; Roberts Mlotkowski Safran & Cole, P.C.

(57) ABSTRACT

The present invention relates to a process for improved interfacial adhesion of dielectrics using patterned roughing. Improved adhesion strength between layers and substrates can be achieved through increasing the roughness of the interface between the materials. Roughness may including any disturbance of an otherwise generally smooth surface, such as grooves, indents, holes, trenches, and/or the like. Roughing on the interface may be achieved by depositing a material on a surface of the substrate to act as a mask and then using an etching process to induce the roughness. The material, acting as a mask, allows etching to occur on a fine, or sub-miniature, scale below the Scale achieved with a conventional photo mask and lithography to achieve the required pattern roughing. Another material is then deposited on the roughened surface of the substrate, filling in the roughing and adhering to the substrate.

16 Claims, 3 Drawing Sheets

U.S. PATENT DOCUMENTS

| | | | |
|---|---|---|---|
| 5,466,626 A | 11/1995 | Armacost et al. | |
| 5,484,224 A | 1/1996 | Lynch | |
| 5,766,968 A | 6/1998 | Armacost et al. | |
| 5,928,836 A * | 7/1999 | Rahman et al. | 430/270.1 |
| 6,007,969 A * | 12/1999 | Hatakeyama et al. | 430/323 |
| 6,093,636 A | 7/2000 | Carter et al. | |
| 6,251,772 B1 * | 6/2001 | Brown | 438/626 |
| 6,387,818 B1 | 5/2002 | Lopatin | |
| 6,415,973 B1 | 7/2002 | Ho et al. | |
| 6,448,131 B1 | 9/2002 | Cabral et al. | |
| 6,501,171 B2 | 12/2002 | Farquhar et al. | |
| 6,504,180 B1 | 1/2003 | Heremans et al. | |
| 6,602,804 B2 | 8/2003 | Allen et al. | |
| 6,607,966 B2 | 8/2003 | Figura et al. | |
| 7,303,994 B2 | 12/2007 | Cooney, III et al. | |
| 2001/0004477 A1 * | 6/2001 | Fukunaga et al. | 427/475 |
| 2002/0030297 A1 | 3/2002 | Gallagher et al. | |
| 2003/0155638 A1 | 8/2003 | Ito | |
| 2005/0133920 A1 * | 6/2005 | Liou et al. | 257/758 |

* cited by examiner

PROCESS FOR INTERFACIAL ADHESION IN LAMINATE STRUCTURES THROUGH PATTERNED ROUGHING OF A SURFACE

CROSS REFERENCE TO RELATED APPLICATIONS

This application is a continuation of U.S. patent application Ser. No. 10/710,034, filed Jun. 14, 2004, now U.S. Pat. No. 7,303,994, the disclosure of which is expressly incorporated by reference herein in its entirety.

BACKGROUND OF INVENTION

1. Field of the Invention

The invention relates to a system and process for interfacial adhesion and, more particularly, to a system and process for improved interfacial adhesion of dielectrics using patterned roughing.

2. Background Description

Laminate structures are used in a number of applications in the field of electronics. In semiconductor chips, integrated chips and various electric devices, such as capacitors, inductors, and resistors, materials are applied to one another in layers, thereby creating laminate structures. To maintain the integrity of the chips and devices, and ensure their reliability, it is generally necessary for the layers to adhere to each other. However, due to desired electrical properties and capabilities, it may be necessary to create a laminate structure where two adjacent layers are formed of materials that have poor adherence properties relative to each other. This may lead to difficulties in creating a chip or device that has the necessary electrical properties while still maintaining integrity and reliability.

Dielectric materials having a low dielectric constant, based on the composition of the material(s) used, often have poor interface adhesion to other materials used in the same device. This poor interface adhesion can lead to decreased reliability of a device, as materials can separate, slip and/or delaminate, thereby causing faults and failures. Moreover, poor interfacial adhesion may be found in other materials that are adhered in a semiconductor chip level environment.

Various attempts have been made to improve interface adhesion to eliminate the effects of dicing. The dicing process may introduce flaws at the edge of a semiconductor device or chip. Such flaws can actually initiate delaminating at the dielectric/capacitor interface or at other interfaces. Additional stresses during packaging can propagate the delaminating into active areas of the semiconductor chip, thereby causing degradation and failure.

Interlocking structures currently exist, such as metal interconnecting and interlocking structures. Examples of such structures include Intelo "button" connectors. However, such metal interconnecting and interlocking structures require the introduction of a specific metal layer to the semiconductor device. A metal layer may not be desirable, based on the type of chip or device being fabricated, or the properties and electrical capabilities desired in the chip or device. Further, a metal layer may actually prevent the realization of the very properties and electrical capabilities for which the chip or device is being fabricated.

SUMMARY OF INVENTION

In a first aspect of the invention, a process for joining a first surface of a substrate to a second surface of a material comprises providing the substrate having the first surface, creating a roughing on the first surface of the substrate, and depositing the material having the second surface on the first surface of the substrate such that the second surface of the material is joined to the first surface of the substrate, where the deposited material fills in the roughing.

In yet another aspect of the invention, a structure having improved interfacial adhesion between a first and a second substrate comprises a first substrate having a first surface which has been roughened and results in a roughing on the first surface, and a second substrate having a second surface, where the second surface of the second substrate is joined to the first surface of the first substrate such that second substrate fills in the roughing of the first surface.

In another aspect of the invention, a process for joining a first substrate, a layer, and a second substrate comprises providing the first substrate having a first surface, depositing the layer on the first surface of the first substrate, perforating the layer with a plurality of holes such that the first surface of the first substrate is accessible through at least one of the holes in the layer, and depositing the second substrate having a second surface on the perforated capping layer, such that the second surface of the second substrate is joined to the first surface of the substrate, and the deposited second substrate fills in the holes of the layer.

BRIEF DESCRIPTION OF DRAWINGS

The above and other features and advantages of the invention will become more apparent to those of ordinary skill in the art by describing in detail exemplary embodiments thereof with reference to the attached drawings in which.

DETAILED DESCRIPTION

Figure 1:
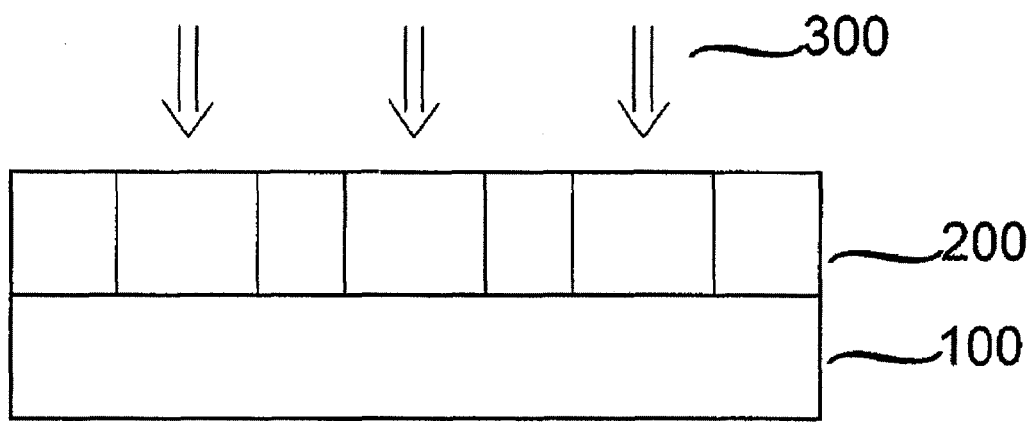
FIG. 1 illustrates a process for etching a surface of a substrate for pattern roughing according to an exemplary embodiment of the invention.

The invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout the specification.

According to an embodiment of the invention, improving the adhesion strength between substrates in an integrated circuit or electrical device can be achieved through increasing the roughness of the interface between the materials. Roughness may include any disturbance of an otherwise generally smooth surface, such as grooves, indents, holes, trenches, or the like. The surface interface, such as a surface interface of substrates used in an integrated circuit, a semiconductor chip, an electrical component (e.g., a capacitor, an inductor, etc.) or the like, may be roughened at a scale that is much finer than the scale of interconnects, such as metal connectors and the like. Thus, by roughening at a finer scale, the adhesion strength may be improved without substantially altering the fabrication process or the structure of the substrate. This etching results in sub-miniature feature roughness at the interface of a substrate.

A process for this roughing may include depositing the substrate that requires adhesion to another material and inducing the roughness. Patterned roughness of the interface may be achieved by depositing a material on a surface of the substrate to act as a mask and then using a etching process to induce the roughness. The material, acting as a mask, allows etching to occur on a fine, or sub-miniature, scale to achieve the required pattern roughing. Such an etching process may use a mask at a fine scale, thereby resulting in fine scale roughing of the surface of the substrate. Another material is then deposited on the roughened surface of the substrate, filling in the roughing and adhering to the substrate. Exemplary embodiments of the present invention will now be described in greater detail below.

FIG. 1 illustrates a process for etching a surface of a substrate for pattern roughing according to an exemplary embodiment of the invention. A substrate 100 is provided. According to an embodiment of the invention, substrate 100 may be a dielectric material. However, it is understood that substrate 100 may be other materials.

FIG. 1 further shows a mask 200 placed on the substrate 100. In the exemplary embodiment of FIG. 1, mask 200 is a photo mask formed from a phase separating polymer which is called a block copolymer mask. Such a mask can be created by phase separating in a very uniform way to produce a columnar arrangement of two phases, where one phase can be easily etched out, thereby leaving a mask of a very fine scale that is uniform. This mask is then exposed to a lithographic process 300 to pattern rough the substrate 100.

For example, a thin film of a block copolymer is spun onto substrate 100. The copolymer film is annealed at a sufficient temperature to facilitate micro phase separation of the blocks and to cause self-organization, such as into a hexagonal array. The film is then exposed to a photolithographic process, such as ultraviolet light, to create the fine scale mask by removing one phase of the copolymer and leaving the other as a mask. The substrate 100 is then etched, such as via a photolithographic method 300, to pattern rough the surface of substrate 100. The use of block copolymers for etching is well known in the art. However, for the sake of completeness, a more detailed discussion of etching using a block copolymer is described in Black, C. T. et al., "Integration of Self-Assembled diblock copolymers for semiconductor fabrication," Applied Physics Letters, Vol. 79, No. 3, (16 Jul. 2001), the contents of which are incorporated herein by reference in their entirety.

Figure 2:
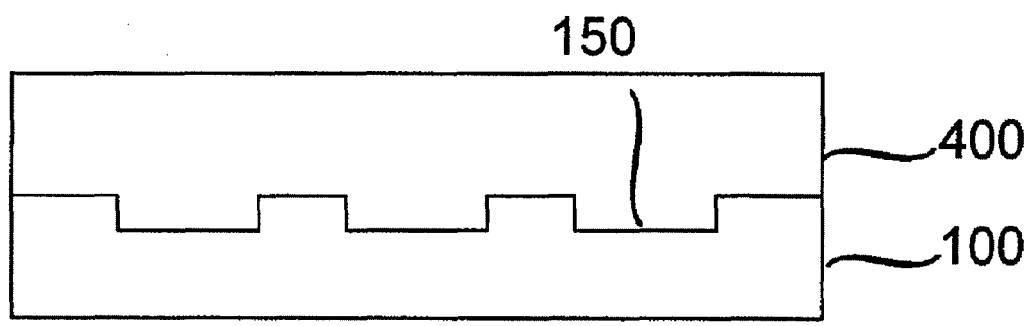
FIG. 2 illustrates two substrates adhered through pattern roughing according to an exemplary embodiment of the invention.

This pattern roughness may be grooves, trenches, holes, indents, and the like, or some combination thereof, depicted as reference numeral 150 of FIG. 2. It should be understood, though, that any roughness configuration may be etched on the substrate. In one exemplary configuration, the roughness is etched in a regular hexagonal pattern, at a depth of about 200 Å.

After the substrate 100 is patterned roughened using the mask and etching, the mask is removed. Removal of the mask may be achieved by any know manner, and the specific process used will generally depend on the type of mask and substrate 100 used. Once the surface of the substrate has been roughened, it can be used by depositing a material, such as another dielectric, on top of the substrate, where it will then fill in the roughness. This forms the micro roughened interface that will provide the increased adhesion.

FIG. 2 illustrates two surfaces adhered through pattern roughing according to an exemplary embodiment of the invention. A material 400 is deposited on the surface of substrate 100, where the material 400 fills in the patterned roughing on the surface of the substrate 100. That is, material 400 fills in the indents, holes, grooves, trenches, etc., generally depicted as reference numeral 150, and is formed by the process described with reference to FIG. 1, i.e., formed on the surface of substrate 100 by the etching process. According to an embodiment of the invention, filling in the indents, holes, grooves, trenches, etc., may include material 400 filling substantially all of the space within the indents, holes, grooves, trenches, etc., such that, for purposes of determining the properties of the resulting integrated circuit, the indents, holes, grooves, trenches, etc., may be treated as not existing.

Thus, the adhesion is improved between the first surface of the substrate 100 and the second surface of the material 400 due to the increased interface area and patterning formed by the roughness. The second surface of the material 400 may be complimentary in nature to the roughened surface of substrate 100, such that the two surfaces interleave and provide an adhered interface. This interleaving may occur due to the complimentary surface of the material 400 acts to fill in the etched surface of substrate 100, as described above. This process may be used for any structure where it is desirable to improve the interfacial adhesion between the substrate 100 and the material 400. For example, substrate 100 and material 400 both may be dielectric materials that have poor interfacial adhesion properties. In such an example, the process of the invention may be used to improve the interface adhesion, thereby reducing delamination and subsequent failure of the chip or device.

Although the example of FIGS. 1 and 2 above is described with reference to a photo mask using a block copolymer, it is understood that the mask may be any type of mask, such as a photo mask, a heat mask, or a chemical mask. According to an embodiment of the invention, mask 200 is a fine scale mask that enables the creation of fine scale patterned roughing. Other examples of masks that could be used include metal deposition to form islands, photo-resist layers with porogen, spin on film with metal particles and annealed metal film. Each of these will now be described in greater detail.

According to an embodiment of the invention, metal deposition could be used to form islands that act as a mask. By way of example, a water soluble metal, such as Sn or In, may be applied to the substrate 100. Post annealing may then be used to agglomerate metal from the continuous film and form islands on the surface of substrate 100. The etching process may then be performed, with the islands acting as the mask. The islands may then be removed, and the material 400 may be deposited on the substrate 100. While this embodiment is described with respect to a water soluble metal, it is understood that other metals that react to annealing in such a manner may also be used.

Alternatively, a photo-resist film with a porogen may be applied to the substrate 100. By applying heat, such as through annealing, the porogen may be burned out or decompose, thereby creating a mask with holes. Such a mask may then be used with etching to form a pattern roughing on the substrate 100. The mask may then be removed, and the material 400 may be deposited on the substrate 100.

A further exemplary embodiment involves using film that is filled with fine metal particles. The film is spun onto the substrate 100, and then burned off, leaving the metal particles behind on the surface of the substrate 100. These particles may then be used as a mask for etching to form a pattern roughing on the substrate 100. The mask may then be removed, and the material 400 may be deposited on the substrate 100. All of the above examples may be represented by the example shown in FIG. 1.

Figure 3:
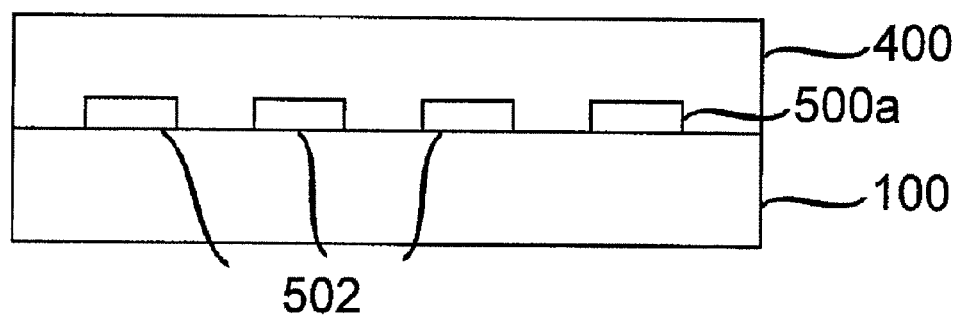
FIG. 3 illustrates two substrates and a layer adhered through pattern roughing according to another exemplary embodiment of the invention.

FIG. 3 illustrates two surfaces and a layer adhered through pattern roughing according to another exemplary embodiment of the invention. In the exemplary embodiment illustrated in FIG. 3, a layer 500a is provided on the substrate 100. Layer 500a may be a capping layer or other type of layer. Holes 502 are then formed by perforating the layer 500a. For example, holes 502 may be formed in layer 500a by using a mask, such as with a mask and etching process described above. Holes 502 perforate the layer 500a, where some or all of the holes 502 penetrate through layer 500a to substrate 100. The depth of the holes may range between about 5 Å and about 1,000 Å, and more specifically between about 50 Å to about 300 Å. However, in some embodiments of the invention, some or all of the holes 502 may perforate layer 500a but not penetrate through to substrate 100. This may occur, for example, where the adhesions properties of substrate 100 and layer 500a are sufficient, but the adhesion properties between layer 500a and material 400 are not sufficient, and thus improved interface adhesion is required.

Material 400 is then deposited on the layer 500a. Material 400 fills in the holes 502, thereby improving the interface adhesion with both substrate 100 and layer 500a. According to an embodiment of the invention, filling in the holes 502 may include material 400 filling substantially all of the spaces within the holes 502 such that, for purposes of determining the properties of the resulting integrated circuit, the holes 502 may be treated as not existing. While this embodiment describes holes 502 in layer 500a, it is understood that grooves, trenches, indents and the like may also be present.

According to an embodiment of the invention, it may be desirable to have a structure with a thin layer on top of the first substrate. By way of example only, a very thin layer or film of a dielectric may be placed on top of a first dielectric substrate. This film is deposited in a thin layer at a range of 5 Å to about 1,000 Å, and more specifically at about 50 Å to about 300 Å, and may be performed for various reasons. This thin layer may act as a capping layer. A photo etching of the film occurs, such as with a photo etching mask, where the film is perforated. That is, the photo etching process perforates the capping layer to create the pattern roughing.

A layer of a second material, such as the second dielectric, is applied and that fills the holes created by the perforation in the layer. The adhesion of the structure is governed not by the adhesion to the capping layer, which might be very weak, but by the regions where the first material is attached to the second material. For example, where a capping layer is located between a first and second dielectric material, there is an improved adhesion for the structure which can lessen or avoid problems where the adhesion to the capping layer might be rather poor. In addition, this may improve the adhesion of the second material to the capping layer as well, such that the integrity of the whole stack or structure may be improved. This process and structure is also represented by FIG. 3, for example.

Figure 4:
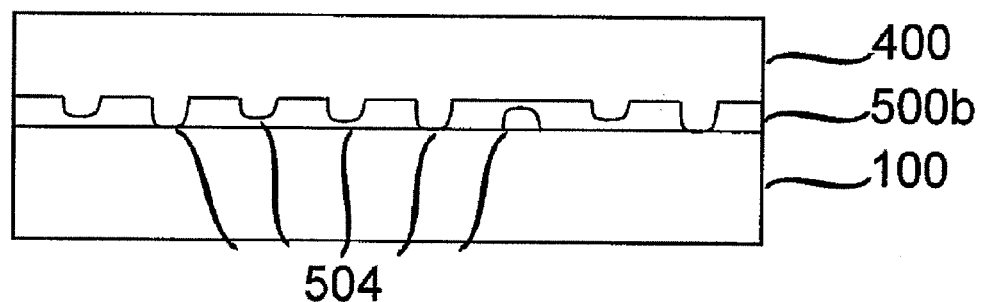
FIG. 4 illustrates two substrates and a layer adhered through pattern roughing according to another exemplary embodiment of the invention.

FIG. 4 illustrates two surfaces and a layer adhered through pattern roughing according to a further exemplary embodiment of the invention. In the exemplary embodiment disclosed in FIG. 4, a thin layer 500b, such as a porous film, is deposited on the substrate 100. This layer may be a separate material, such as a capping layer, or may be of the same material as the substrate 100. The porous film 500b may have a number of holes 504 within the film, in which some or all penetrate through to the substrate 100. As illustrated in the example of FIG. 4, the holes may be irregularly or randomly spaced within the porous film 500b. Holes 504 perforate the layer 500b, where some or all of the holes 504 penetrate through layer 500b to substrate 100. However, some embodiments of the invention, some or all holes 504 may perforate layer 500b but not penetrate through to substrate 100. Again, this may occur, for example, where the adhesions properties of substrate 100 and layer 500b are sufficient, but the adhesion properties between layer 500b and material 400 are not sufficient, and thus improved interface adhesion is required. The depth of this layer may be between about 5 Å and about 1,000 Å, and more specifically about 50 Å to about 300 Å, and the depth of the holes may range from about 5 Å to about 1,000 Å, and more specifically about 50 Å to about 300 Å.

Material 400 is deposited on the thin layer 500b. Material 400 fills in the holes 504, thereby improving the interface adhesion with both the substrate 100 and layer 500b. According to an embodiment of the invention, filling in the holes 504 may include material 400 filling substantially all of the space within the holes 504 such that, for purposes of determining the properties of the resulting integrated circuit, the holes 504 may be treated as not existing. While this embodiment describes holes 504 in layer 500b, it is understood that grooves, trenches, indents and the like may also be present.

Alternatively, thin layer 500b may be material with a porogen. By applying heat, the porogen may be burned out, leaving a thin film 500b with a number of holes 504, in which none, some or all penetrate through to the substrate 100. As before, material 400 is deposited on the thin layer 500b. Material 400 fills in the holes 504, thereby improving the interface adhesion with both the substrate 100 and capping layer 500a. Again, filling in the holes 504 may include material 400 filling substantially all of the space within the holes such that, for purposes of determining the properties of the resulting integrated circuit, the holes 504 may be treated as not existing. While this embodiment describes holes 504 in layer 500b, it is understood that grooves, trenches, indents and the like may also be present.

Figure 5:
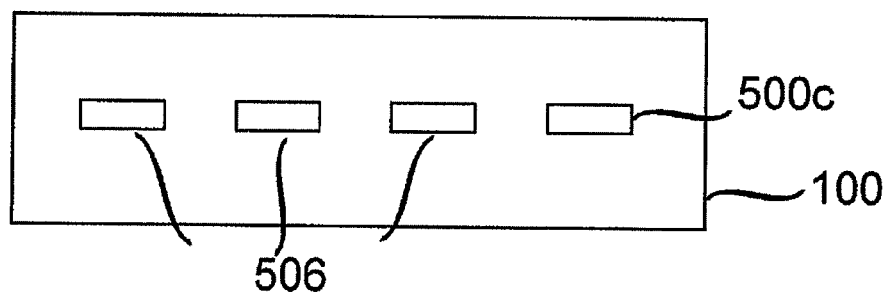
FIG. 5 illustrates a layer within a substrate adhered through pattern roughing according to another exemplary embodiment of the invention.

FIG. 5 illustrates a layer within a substrate adhered through pattern roughing according to another exemplary embodiment of the invention. In the example illustrated in FIG. 5, a substrate 100 has a thin film layer 500c deposited thereon. While thin film layer 500c has been illustrated as a porous film, such as that found in the exemplary embodiment described in FIG. 3 above, it is understood that other types of thin film layers, including that described in the exemplary embodiment of the FIG. 4, may also be used.

The porous film 500c may have a number of holes 506 within the film, in which none, some or all penetrate through to the substrate 100. Additional material of the same type as the substrate 100 is deposited on the thin layer 500c. This material 100 fills in the holes 506, thereby improving the interface adhesion within the substrate 100 and the thin layer 500c. According to an embodiment of the invention, filling in the holes 506 may include material 100 filling substantially all of the space within the holes 506 such that, for purposes of determining the properties of the resulting integrated circuit, the holes 506 may be treated as not existing. While this embodiment describes holes 506 in layer 500c, it is understood that grooves, trenches, indents and the like may also be present.

Figure 6:
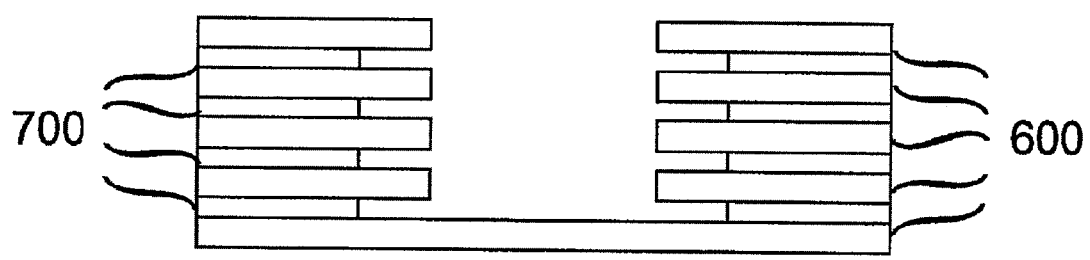
FIG. 6 illustrates pattern roughing according to another exemplary embodiment of the invention.

FIG. 6 illustrates pattern roughing according to another exemplary embodiment of the invention. According to an embodiment of the invention, a multilayer structure may be created, where a first substrate 600 and a second substrate 700 are alternately stacked, where the first substrate 600 and the second substrate 700 are of different phases. That is, a very finely spaced multilayer structure is created where there is one phase, e.g., one layer that is easily etched, such as substrate 700, and there is another phase, e.g., another layer that is resistant to etching, such as substrate 600. The resulting trench-like structure is accessed and exposed to an etching process, such as an etching chemical, to remove some portion of the layer susceptible to etching (substrate 700) so that it will leave a roughness on the sidewall of the structure. A material (not shown) is deposited within the trench and adheres to the structure through the first substrate 600 and the second substrate 700.

The invention may allow for pattern roughening of a substrate at a fine or sub-miniature scale below a scale achieved with conventional photo masks and lithography.

A further embodiment of the invention may include selectively applying pattern roughening to specific areas of the substrate or chip, such as by using a block out mask. For example, if the middle of the substrate needs to remain unchanged, the edge and the corners of the substrate may be pattern roughened. Other configurations may also be used.

While the invention has been described in terms of exemplary embodiments, those skilled in the art will recognize that the invention can be practiced with modifications and in the spirit and scope of the appended claims.

What is claimed is:

1. A process for joining surfaces of portions of an integrated circuit, a semiconductor device, or an electrical component, comprising the steps of:
   providing a substrate having a first surface, wherein the substrate is composed of a layer of a first dielectric material;
   creating a roughing on the first surface of the substrate, wherein the roughing extends only partially into the layer of the first dielectric material; and
   depositing a second dielectric material having a second surface on the first surface such that the second surface of the second dielectric material is joined to the first surface of the substrate and substantially fills in the roughing,
   wherein the creating the roughing comprises:
      applying a block copolymer solution having at least two phases to the first surface of the substrate;
      annealing the block copolymer solution at a sufficient temperature to facilitate micro phase separation of blocks of the block copolymer solution and to cause self-organization;
      removing at least one phase of the at least two phases of the block copolymer solution and leaving another one of the at least two phases as a mask; and
      etching the first surface using the mask.

2. The process according to claim 1, wherein the creating step comprises:
   applying the mask;
   etching the first surface using the mask; and
   removing the mask.

3. The process according to claim 2, where the mask is a fine scale photo mask and the etching is performed using a lithographic process.

4. The process according to claim 1, wherein the creating the roughing comprises etching the first surface of the substrate.

5. The process according to claim 1, wherein:
   the first surface of the substrate comprises an upper surface of the substrate,
   the creating the roughing comprises etching a groove, trench, or indent in the first surface of the substrate,
   a depth of the groove, trench, or indent is less than a thickness of the substrate, and
   the second dielectric material completely fills in the groove, trench, or indent.

6. A process for joining surfaces of portions of an integrated circuit, a semiconductor device, or an electrical component, comprising the steps of:
   providing a substrate having a first surface, wherein the substrate is composed of a layer of a first dielectric material;
   forming a mask on the first surface of the substrate;
   etching the first surface of the substrate using the mask, wherein the etching forms a roughing in the first surface of the substrate, and wherein a depth of the roughing is less than a thickness of the layer of the first dielectric material such that the roughing extends only partially into the layer of the first dielectric material;
   removing the mask from the first surface of the substrate; and
   depositing a second dielectric material having a second surface on the first surface such that the second surface of the second dielectric material is joined to the first surface of the substrate and substantially fills in the roughing, wherein the second dielectric material completely fills in the roughing,
   wherein the forming the mask comprises:
      applying a composition to the first surface of the substrate; and
      heating the composition to form the mask,
   using the adhered substrate and the second dielectric material in an integrated circuit, a semiconductor device, or an electrical component,
   wherein the roughing increases adhesion and reduces delamination between the substrate and the second dielectric material; and
   the roughing has a scale that is finer than a scale of interconnects and metal connectors.

7. The process according to claim 6, wherein the forming the mask comprises:
   applying the composition as a block copolymer solution having at least two phases to the first surface of the substrate;
   annealing the block copolymer solution at a sufficient temperature to facilitate micro phase separation of blocks of the block copolymer solution and to cause self-organization; and
   removing at least one phase of the block copolymer solution.

8. The process according to claim 6, wherein the forming the mask comprises:
   applying the composition as a photo-resist material comprising porogen to the first surface of the substrate; and
   applying heat to the photo-resist material to burnout the porogen to create holes in the mask.

9. The process according to claim 1, wherein the block copolymer is applied to the first surface of the substrate by spinning the block copolymer onto the first surface of the substrate.

10. The process according to claim 9, wherein the at least one phase of the block copolymer is removed by exposing the annealed block copolymer to a photolithographic process.

11. The process according to claim 10, wherein the roughing has a depth of about 200 Å.

12. A process for joining surfaces of portions of an integrated circuit, a semiconductor device, or an electrical component, comprising the steps of:
  providing a substrate having a first surface, wherein the substrate is composed of a layer of a first dielectric material;
  creating a roughing on the first surface of the substrate, wherein the roughing extends only partially into the layer of the first dielectric material; and
  depositing a second dielectric material having a second surface on the first surface such that the second surface of the second dielectric material is joined to the first surface of the substrate and substantially fills in the roughing,
  wherein the creating the roughing comprises:
    applying a photoresist film comprising a porogen to the first surface of the substrate;
    applying heat to burn out the porogen thereby creating a mask with holes; and
    etching the first surface using the mask.

13. The process according to claim 12, further comprising removing the mask prior to the depositing the second dielectric material.

14. The process according to claim 13, wherein the mask comprises a fine scale, and the roughing has a depth of about 200 Å.

15. The process according to claim 12, further comprising using the adhered substrate and the second dielectric material in an integrated circuit, a semiconductor device, or an electrical component, wherein:
  the roughing increases adhesion and reduces delamination between the substrate and the second dielectric material; and
  the roughing has a scale that is finer than a scale of interconnects and metal connectors.

16. The process according to claim 1, further comprising using the adhered substrate and the second dielectric material in an integrated circuit, a semiconductor device, or an electrical component, wherein:
  the roughing increases adhesion and reduces delamination between the substrate and the second dielectric material; and
  the roughing has a scale that is finer than a scale of interconnects and metal connectors.

* * * * *